March 14, 1961 P. J. PRICE ET AL 2,975,304

SOLID STATE DEVICES

Original Filed Aug. 7, 1956 5 Sheets-Sheet 1

*INVENTORS*
PETER J. PRICE
JOHN W. HORTON

*BY* Wesley De Bruin

ATTORNEY

March 14, 1961 P. J. PRICE ET AL 2,975,304

SOLID STATE DEVICES

Original Filed Aug. 7, 1956 5 Sheets-Sheet 3

United States Patent Office 2,975,304
Patented Mar. 14, 1961

2,975,304

SOLID STATE DEVICES

Peter J. Price and John W. Horton, New York, N.Y., assignors to International Business Machines Corporation, New York, N.Y., a corporation of New York Original application Aug. 7, 1956, Ser. No. 602,602. Divided and this application Aug. 15, 1958, Ser. No. 755,218

3 Claims. (Cl. 307—88.5)

This application is a division of copending application, Serial Number 602,602, filed August 7, 1956, now abandoned.

This invention relates to two-terminal solid state electronic devices and more particularly to such devices wherein the frequency of operation is in the millimeter-to-centimeter range and is determined by the frequency of nostron orbiting of the carriers.

In the prior art the two-terminal electrodes must be formed by particular processes and from certain specified materials to provide a device having a negative-resistance characteristic. If these electrodes are not fused to the germanium by these particular processes, the operation of the device does not exhibit a negative-resistance characteristic Hence, the negative-resistance characteristic is a fabricated one in the sense that it is provided as a result of the use of certain electrodes fabricated and fused to the germanium in a certain manner.

In the prior art, several methods are employed to generate microwave power. A first method involves the shooting of a beam of electrons with energy of the order of one million volts through a waveguide and extracting approximately a single watt of millimeter power from the guide. This beam of electrons may also be shot through a resonant cavity which is tuned to a subharmonic of the desired millimeter frequency. A relatively small amount of power at the subharmonic frequency is extracted from the cavity. In a second method, a centimeter waveguide is coupled through a silicon crystal rectifier to a millimeter waveguide. Power is transferred through the rectifier from a K-band klystron into the centimeter waveguide. A small fraction of the input power is extracted from the millimeter waveguide at a harmonic frequency generated by the rectifier.

The speed of operation of the prior art devices is limited by the time required to change the local distribution of the carriers. For example, the maximum speed of operation of transistor oscillators is determined by the time required for the carriers to diffuse to the collector electrode. This local distribution of the carriers or the achievement of a state of thermal equilibrium or semi-thermal equilibrium limits the operating speed of the devices.

The invention establishes that when a voltage at least equal to a certain predictable critical voltage is applied across a semi-conductor comprising a nostron transit region, a carrier (i.e., electron or hole) leaves the vicinity of one face of that region and passes to the vicinity of another face of that region, stops, and returns to its initial position in a predictable predetermined time. This natural phenomenon is termed herein a nostron orbit or nostron oscillation and is a basic phenomenon utilized by each embodiment of the invention. Hence, a device utilizing this phenomenon is referred to as a nostron device or nostron and has a speed of operation which is not limited in any way by the natural relaxation time for a change of the thermal equilibrium state.

The device of the invention is capable of assuming a high current condition of stability and a low current condition of stability. When the device is in the high current condition of stability, the nostron orbit traversed by the carriers is such that the carriers are intercepted or collected by the collector electrode. When the device is in the low current condition of stability, a higher voltage is applied across the electrodes, a nostron orbit smaller in space than that executed when the device is in the high current condition is effected and relatively fewer carriers are collected by the collector electrode. Hence, when in the high current condition, the distance travelled by the carriers in executing a nostron orbit is larger than that travelled when the device is in the low current condition of stability. If collisions do not occur, therefore, no carriers are collected by the collector electrode when the device is in the low current condition of stability. However, when collisions occur, some of the carriers proceed to execute a new nostron orbit which is physically closer at its beginning to the collector electrode. Hence, it is this interruption of the nostron orbiting of the carriers which causes some to be collected at the collector electrode when a relatively high voltage is applied across the semiconductor to place the device in the low current condition of stability. The actual time consumed by a carrier in the execution of a nostron orbit is constant and is therefore independent of the stable condition of the device.

Accordingly, it is a principal object of the invention to provide novel two-terminal semiconductor devices wherein the electrodes are required merely to serve as a means of applying a voltage across the semiconductor and introduce carriers therein to provide operation in accordance with a negative-resistance characteristic inherent to the semiconductor device.

Another object is to provide a two-terminal semiconductor circuit device wherein the mere presence of a critical voltage across the semiconductor nostron region causes the operation of the device in accordance with its inherent negative-resistance characteristic.

Another object is to provide a novel and intrinsically simple means for generating power in the microwave frequency range.

Another object is to provide novel nostron circuit means operable at substantially the frequency of a nostron orbit.

Another object is to provide novel electronic means for providing an increased power output efficiency at millimeter-to-centimeter frequencies.

A further object is to provide electronic circuit means employing a semiconductor wherein the time of transit of the carriers across the semiconductor nostron region is representative of the switching time of the circuit.

A further object is to provide a semiconductor circuit arrangement having a frequency of operation substantially equal to the natural nostron frequency of the semiconductor nostron region.

Still another object is to provide a novel bistable storage device employing a semiconductor wherein the time required to switch the device from either condition to the other is substantially equal to the time required to effect a single nostron oscillation.

Another object is to provide a novel monostable nostron circuit device.

Still another object is to provide an oscillator employing a semiconductor and operable during substantially the time consumed in performing a nostron orbit in the semiconductor nostron region utilized.

A further object is to provide a novel circuit including a two-terminal semiconductor wherein the speed of circuit operation is not limited by the thermal equilibrium of the distribution of the carriers, a steady state approaching thermal equilibrium, or any other diffusion or drift mobility process within the semiconductor.

Other objects of the invention will be pointed out in the following description and claims and illustrated in the accompanying drawings, which disclose, by way of example, the principle of the invention and the best mode, which has been contemplated, of applying that principle.

Figure 7A:
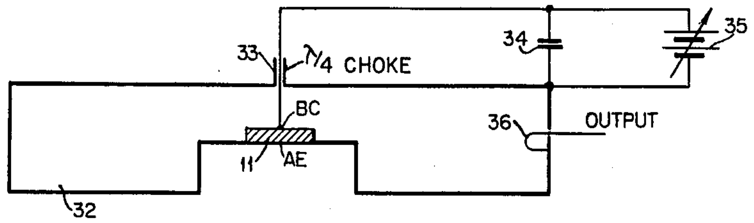
Figure 7B:
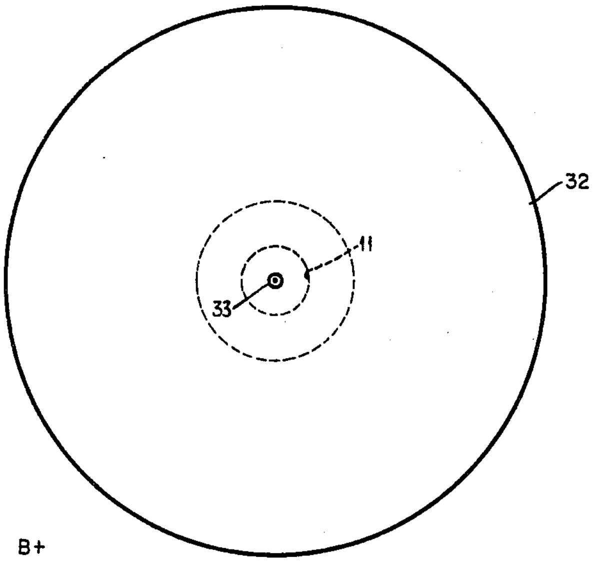
Figure 8:
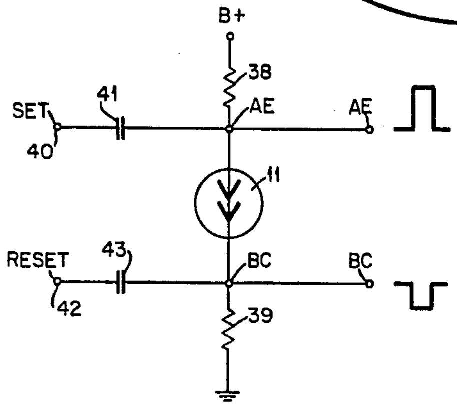
Figure 8A:
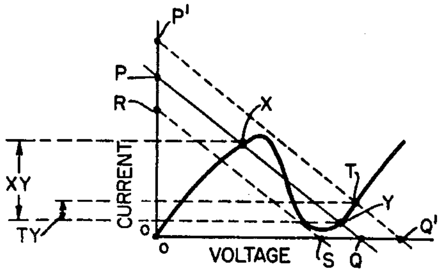
Figure 8B:
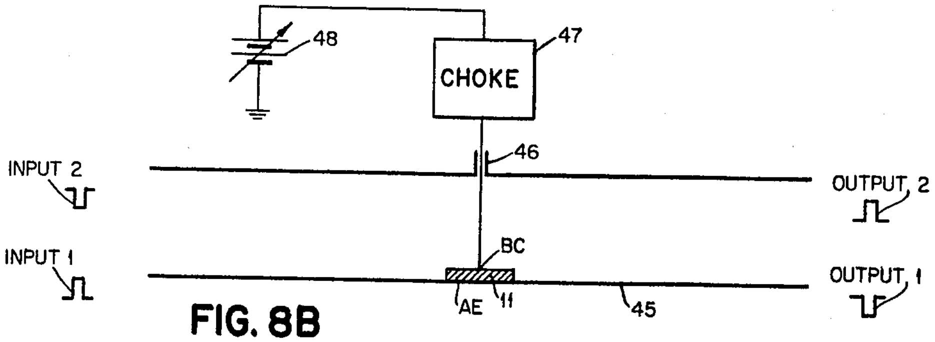
Figure 8C:
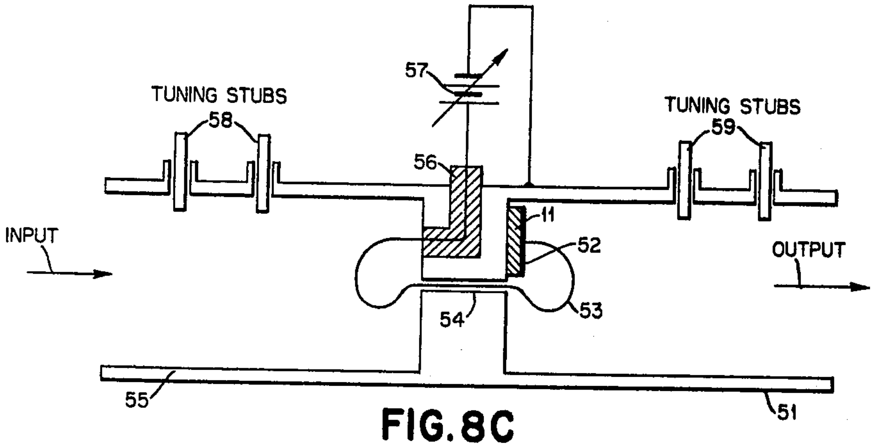
Figure 8D:
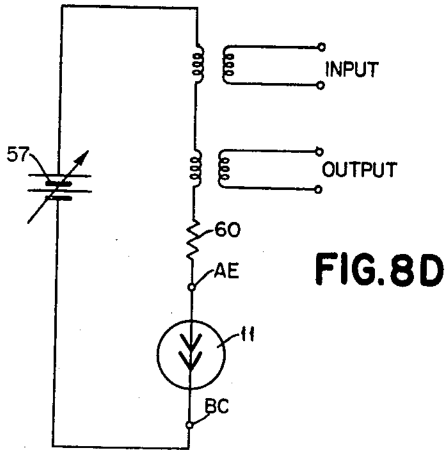
Figures 9, 9A:
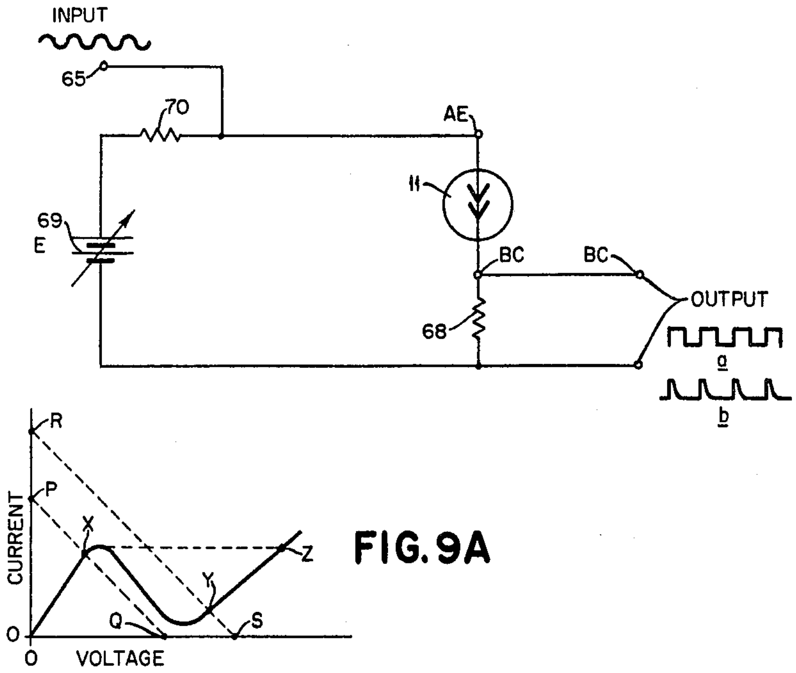
Figures 10, 11:
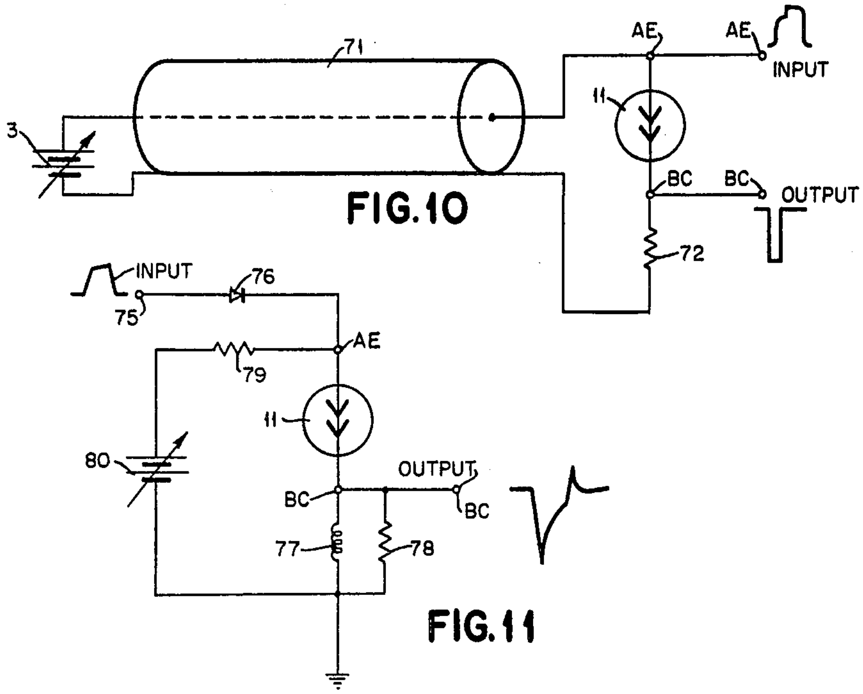

Figs. 7A and 7B comprise a circuit diagram and diagrammatic representation of an oscillator of the invention utilizing a circular waveguide;

Fig. 8 is a circuit diagram of a bistable storage element of the invention;

Fig. 8A is a diagram illustrating the operation of the circuit shown in Fig. 8;

Figs. 8B and 8C each comprise a circuit diagram and a diagrammatic representation of an embodiment of a bistable storage element of the invention utilizing a waveguide;

Fig. 8D is a circuit diagram of the equivalent circuit for the embodiment shown in Fig. 8C;

Fig. 9 is a circuit diagram of a pulse generator of the invention;

Fig. 9A is a diagram illustrating the operation of the circuit of Fig. 9;

Fig. 10 is a circuit diagram of a coaxial type pulse amplifier of the invention; and Fig. 11 is a circuit diagram of a monostable amplifier-inverter of the invention.

Briefly, the invention utilizes a current-voltage characteristic curve including a negative-dynamic-resistance portion to provide a plurality of extremely high speed devices. This negative-dynamic-resistance characteristic is provided by the presence of nostron orbiting carriers in a two-terminal semiconductor crystal such as, for example, germanium. This nostron orbiting is caused by the mere presence of a certain voltage gradient between the two faces of the nostron region of the crystal and is in no way dependent upon or maintained by collisions in this region between the carriers, the crystal irregularities; and thermal vibrations. Hence, a change in the stable condition of the devices of the invention is independent of thermal equilibrium or a drift mobility process within the nostron region of the crystal. The inherent cutoff frequency in the operation of the devices of the invention is determined by the transit time of the carriers across the nostron region and hence by the nostron frequency. The time required to switch a device fabricated in accordance with the invention from one stable condition to the other need be no more than a small fraction of a millimicrosecond. In embodiments using lumped impedance elements as distinguished from distributed impedance elements, this time will be increased because of these lumped elements.

An explanation of the physical basis of the invention is given prior to the description of devices utilizing the nostron phenomenon. This will show how a circuit element exhibiting a current-voltage characteristic with a negative-dynamic-resistance portion may be realized on the basis of the dynamics of the individual current-carrying particles or carriers (electrons and holes). The basic principle depends only on the fact that the crystal medium in which the particles move has a periodic structure, whereas in existing semiconductor devices it depends instead on the way in which the equilibrium state of the carriers in these devices is maintained and on the way in which the applied potentials disturb this equilibrium state. To facilitate the description of the principle of the invention, we first analyze the simple but imaginary case of a one-dimensional crystal where the carriers are assumed to be electrons.

In free space the energy $\epsilon$ and momentum $p$ of an electron moving in one dimension, for example, in the $x$ direction, are related by the equation $$\epsilon=\frac{p^2}{2m} \quad (1)$$

where $m$ represents the mass of the electron. The velocity $u$ is given by $$u=\frac{d\epsilon}{dp} \quad (2)$$

and hence by $$u=\frac{p}{m} \quad (3)$$

If an electric field E is applied in the $x$ direction, then a force $$F=-eE \quad (4)$$

acts on the electron where $-e$ is its charge. The fundamental equation for the motion of the electron is the acceleration equation $$\frac{dp}{dt}=F \quad (5)$$

By combining Equations 3, 4 and 5 we obtain the result $$\frac{du}{dt}=\frac{-eE}{m} \quad (6)$$

The displacement $x$ of the electron may be obtained from Equation 6 and the relation $$\frac{dx}{dt}=u \quad (7)$$

For example, if at time $t=0$ we have $x=0$ and $u=0$, then at other times $$x=-\left(\frac{eE}{2m}\right)t^2 \quad (8)$$

Figures 1A, 1B, 1C, 2:
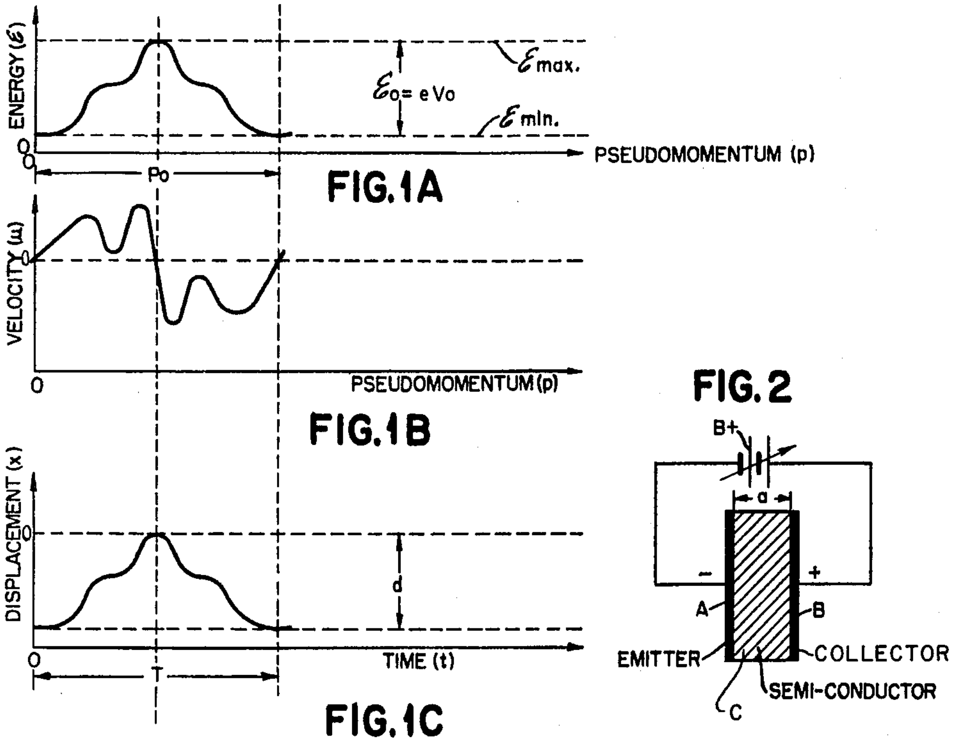
Figs. 1A, 1B and 1C represent diagrams explanatory of the nostron phenomenon utilized by the invention.
Fig. 2 is an idealized diagram illustrating realization of the nostron phenomenon.

In a crystal the dynamics of the electron are modified by the forces acting between it and the atoms of the crystal. Of fundamental importance is the fact that the arrangement of the atoms in space is periodic and hence the atomic forces acting on the electron have a periodicity in space. One consequence of this fact is that all energies are not permitted to an electron in free motion in a perfect crystal, but only certain ranges or "bands" of energy. Of the above Equations 2, 4, 5 and 7 remain true for one-dimensional motion in an imaginary one-dimensional crystal. The momentum $p$, however, is now the actual momentum of the electron together with the momentum it transfers to the crystal through the atomic forces. The momentum $p$ is sometimes termed the "pseudomomentum" of the electron. The changes in the dynamics come from the fact that, because of the periodicity of the crystal, the energy $\epsilon$ is a periodic function of the pseudomomentum $p$. Fig. 1A illustrates this fact.

The energy range $\epsilon_{min.} \leq \epsilon \leq \epsilon_{max.}$ of width $\epsilon_0$, from the maximum to the minimum energy of the function $\epsilon(p)$ is one of the allowed energy ranges for free motion. For each such range or band there is a distinct periodic function $\epsilon(p)$. Fig. 1B illustrates the velocity function $u(p)$ derived from Fig. 1A by the Equation 2. The period $p_0$ of the function $\epsilon(p)$ is related to the period of repetition of the crystal atomic lattice in space L by the equation $$p_0 L = h \qquad (9)$$

where $h$ is Planck's constant, having the value $$6.625 \times 10^{-27} \text{ erg-sec.}$$

The lattice constant L is defined as the smallest distance such that the crystal structure is identical as seen by points separated by this distance. An alternative description of these same facts, common in the literature of physics, replaces the pseudomomentum $p$ by the wavenumber, $$k = \frac{2\pi p}{h}$$

of the electron wavefunction. It is known that the energy $\epsilon$ as a function of $k$ has a period of $$\frac{2\pi}{L}$$

and hence as a function of $p$ it has a period of $$\frac{h}{L}$$

The energy repeats itself when $k$ changes by $$\frac{2\pi}{L}$$

or $p$ changes by $$\frac{h}{L}$$

Also, the physical state of the electron is identical for pseudomomenta $p$ is differing by any integer multiple of $p_0$. A detailed description of these matters is given in the book "Wave Propagation in Periodic Structures," by Leon Brillouin, published by Dover Publications, New York, 1953.

We now examine the motion of the electron, subject to an applied electric Field E, in the crystal. The rate of change of the electron's energy $\epsilon$ is, by Equations 2, 4, 5 and 7

$$\frac{d\epsilon}{dt} = \frac{d\epsilon}{dp}\frac{dp}{dt} = uF = -eE\frac{dx}{dt} \qquad (10)$$

Let us now integrate this equation for an electron which at time $t=0$ is at the origin $x=0$ of coordinates and has the minimum energy in the band $\epsilon_{min.}$. According to Equation 2, it will also have zero velocity $u$ at $t=0$. Then $$\epsilon(t) = \epsilon_{min.} - eEx \qquad (11)$$

It follows from this result that the electron can move only as far as the point $x=-d$, where $$eEd = \epsilon_{max.} - \epsilon_{min.} = \epsilon_0 \qquad (12)$$

To understand how this limitation is realized in practice, we consider the actual displacement $x(t)$. From equations 4 and 5 it follows that $p$ changes at a constant rate:

$$\frac{dp}{dt} = -eE = \text{constant} \qquad (13)$$

Since $\epsilon$ is a periodic function of $p$, it will vary periodically in time. Since, by Equation 2, $u$ is a periodic function of $p$, it too will vary periodically in time. In consequence, by Equation 7, $x$ will vary periodically in time. The displacement of the electron in time is illustrated in Fig. 1C. By the time the electron reaches the point $x=-d$, its velocity $u$ has decreased to zero. The velocity then changes sign and the electron returns to the point $x=0$ after which the cycle repeats. The period of the orbit is the time required for $p$ to increase or decrease by $p_0$, according to Equation 11. Therefore, the period is $$T = \frac{p_0}{eE} = \frac{h}{eEL} \qquad (14)$$

The motion described above will be termed a nostron motion or nostron orbit. The period T of the motion will be called the nostron period and its inverse the nostron frequency.

An actual crystal is a three-dimensional atomic structure, and the arrangement of atoms in it has a three-dimensional periodicity. Hence, the above analysis must be generalized to apply to this real case. The Equations 2, 4, 5, 7 and 10 are replaced by vector equations.

$$u_i = \frac{\partial \epsilon}{\partial p_i} \qquad (2')$$

$$F_i = -eE_i \qquad (4')$$

$$\frac{dp_i}{dt} = F_i \qquad (5')$$

$$\frac{dr_i}{dt} = u_i \qquad (7')$$

$$\frac{d\epsilon}{dt} = -e\left(E_1\frac{dr_1}{dt} + E_2\frac{dr_2}{dt} + E_3\frac{dr_3}{dt}\right) \qquad (10')$$

where $p_i$ is one of the components, $p_1$, $p_2$, $p_3$, of the pseudomomentum vector in a Cartesion system of axes, and similarly for $E_i$, $F_i$, and $u_i$ and $r_i$ is a component or the displacement (replacing $x$). The energy function $\epsilon(p_1, p_2, p_3)$ has a three-dimensional periodicity in the pseudomomentum space. As in the one-dimensional case, there is a series of bands, $\epsilon_{min.} \leq \epsilon \leq \epsilon_{max.}$ of allowed energies for free motion. The analog of 11 is $$\epsilon t = \epsilon_{min.} - e(E_1 r_1 + E_2 r_2 + E_3 r_3) \qquad (11')$$

From these equations we see that the nostron orbits must occur in an actual three-dimensional crystal subject to an electric field. For any chosen direction in space for the field, for example, the "1" direction of the above coordinate system, the point in pseudomomentum space representing the state of the electron will move in a straight line in the corresponding direction at a constant speed given by (4') and (5'). If this point is at one of the points of minimum energy, termed a "band edge point," at $t=0$, then the electron is starting from a state of rest or zero velocity. The maximum energy possible for this electron, in its free motion in the band, depends on the direction of the applied field and is not in general the actual maximum energy in the band. This energy is denoted hereinafter by $[\epsilon_{max.}]$. It is rather the maximum value of $\epsilon(p_1, p_2, p_3)$ on a line in pseudomomentum space in the direction in reciprocal space corresponding to the field direction and passing through the band edge point. Then 12 is replaced by $$eEd = [\epsilon_{max.}] - \epsilon_{min.} \leq \epsilon_0 \qquad (12')$$

where E and $d$ are the actual field strength and distance travelled in the direction of the field. The actual periodicity of the energy function along the path in pseudomomentum space likewise will depend on the direction of the applied field, so we denote it by the symbol $[p_0]$. Then the nostron period will be given by $$T = \frac{p_0}{eE} \qquad (14')$$

It should be noted that, because of the complicated configuration of the function $\epsilon$ $(p_1, p_2, p_3)$ in actual cases, the velocity, which is given by (2') will not in general be in the direction of the applied field. Hence, the nostron orbit will be a complicated path in real space.

Germanium is a cubic crystal, with its atoms arranged in the pattern described by crystallographers as a "diamond lattice." The lattice constant is actually the length of the sides of a cube containing eight atoms and its value is $$L=5.66\times10^{-8}\text{ cm.} \tag{15}$$

The band-edge points, for the band in which the free electrons move, lie in the (1, 1, 1) directions relative to the center of symmetry of the band. A description of the geometry of this band, and of the band in which the holes move, is given in the article entitled "The Electronic Energy Band Structure of Germanium and Silicon" by Frank Herman, published in the Proceedings of the Institute of Radio Engineers, vol. 43, No. 12, December 1955, and beginning on page 1703. For an electric field applied in the (1, 1, 1) directions, $p_0$ is given by the relation $$[p_0]_{(1,1,1)}L=h\sqrt{3} \tag{16}$$

This value is substituted in Equation 14 to determine the nostron period. It is useful to express the period in terms of the corresponding wave length of electromagnetic radiation:

$$\lambda=cT \tag{17}$$

where $c$ is the velocity of light. By combining (14), (16) and (17) we obtain $$\lambda_{(1,1,1)}E=\frac{hc\sqrt{3}}{Le}=\phi\sqrt{3} \tag{18}$$

Here we introduce a useful constant for the crystal, $$\phi=\frac{hc}{Le} \tag{19}$$

With the value of L for germanium given by (15), $L$=2,200 volts. We shall see below that, for the case of germanium, in the device to be described, the fields E applied will be of the order of magnitude a kilivolt per centimeter. Hence, the values of $\lambda$ will be of the order of a few centimeters (the microwave range) and the nostron frequencies of the order of magnitude 10 kilo-megacycles.

The idealized embodiment of the invention, illustrated by Fig. 2, consists of slab of a crystal, of thickness $a$, in which electrons may move freely, provided with an electrode A which emits electrons under the influence of an applied field and an electrode B which collects electrons which reach it and delivers them to an external circuit. If the electrons emitted by A are for practical purposes at rest or, in other words, have energies exceeding the band edge energy $\epsilon_{\text{min.}}$ by an amount small compared with $[\epsilon_{\text{max.}}]-\epsilon_{\text{min.}}$, and if they may move freely in the crystal, then it follows from Equation 12' that there is a critical potential difference $V_0$ given by $$eV_0=[\epsilon_{\text{max.}}]-\epsilon_{\text{min.}} \tag{20}$$

such that the electrons are collected at B if the potential difference between A and B is less than $V_0$. If this potential difference exceed $V_0$, then the electrons emitted from A will execute a nostron orbit in which they do not travel as far as B but instead return to A. It is a consequence of this behavior that the device exhibits a negative dynamic resistance for applied potentials in the neighborhood of the value for which the potential difference between A and B is $V_0$. In order for the electrons to move freely between A and B and execute complete nostron orbits, it is necessary that the probability of a collision, in the course of the orbit, with crystal irregularities and thermal vibrations be small. This condition can be realized, for example, for thickness of a few microns and for a crystal temperature of 4.2 degrees absolute, the normal boiling point of liquid helium. For germanium, $V_0$ is a few tenths of a volt (depending on the direction of the field E, that is, the direction normal to the electrode faces), and hence if $a$ is a few microns, then for the critical applied potential, the field E will be of the order of magnitude of a kilovolt per centimeter.

The actual time consumed in effecting a nostron orbit is between $10^{-10}$ seconds and $10^{-12}$ seconds. Hence, it is seen that the switching of the nostron device of the invention from either stable condition to the other is much faster than the switching of other semiconductor devices. During operation the carriers utilized by the nostron device in the nostron region are always under the control of an electric field. Hence, in order to switch the device, it is necessary to establish an electric field in the nostron region different from that present prior to the switching. In order to effect switching, it is also necessary to collect the carriers which are then in the process of effecting nostron orbits, i.e., the carriers which are in transit and have not completed the nostron orbit are collected. The actual switching time of the device or the time required to collect the carriers should, under optimum conditions, be substantially the time required to effect a single nostron orbit.

To facilitate the description of the invention, analysis hereinabove assumed that the carrier was an electron, which is the atomic negatively charged particle, moving freely in the crystal. The invention may also be practiced when the carrier is a positively charged particle, or hole which is a vacancy in an otherwise filled band of the crystal. In a semiconductor or solid insulator, as contrasted with a metal, the bands of allowed electronic energy may be divided into valence bands and conduction bands, such that all the valence band energies are lower than any of the conduction band energies and such that in the state of lowest energy the valence bands are full, in the sense that every possible electron state in each such band has an electron in that state, while all the conduction bands are empty or contain no electrons. When electrons are the carriers, the lowest of the conduction bands is utilized and the moving electrons occupy states in that band. If an electron is removed from the highest valence band of the crystal, the resulting vacancy has the properties of a positively charged particle, with charge equal and opposite to the charge of the electron, and may move through the crystal as a carrier particle. This particle is termed a hole. The motion of the hole in a crystal is described by the same equations as set forth above for the motion of an electron in the crystal, with the exception that in Equations 2, 4, 13, 2' and 4' the sign on the right should be changed (plus to minus or minus to plus). The equations describing and specifying the operation of the nostron device, in particular (12), (14), (14'), (16), (17), (18) and (19) are unchanged, but it should be noted that a hole starting from rest will normally be in a band-edge state for which $\epsilon(p_1, p_2, p_3)$ is a maximum, i.e., the vacant electronic state will be a state of maximum energy of the highest valence band, and consequently in (12') and (20) it is $\epsilon_{\text{min.}}$ rather than $\epsilon_{\text{max.}}$ which should be enclosed in brackets to indicate that it represents a conditional minimum, the minimum band energy for the particular nostron orbit, determined by the direction of the applied electric field relative to the crystal axes.

In Fig. 2 the idealized embodiment of the invention includes a single semiconductor C of thickness $a$. Emitter electrode A and collector electrode B are provided at opposite faces of the crystal as shown. Electrodes A and B may be made of metal or may comprise alloyed regions of the crystal C. The distance, $a$, between these electrodes represents the thickness of the nostron region. A battery B+ applies a predetermined voltage across the nostron region of the crystal.

Figure 2A:
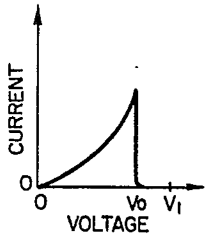
Fig. 2A is an idealized diagram representing the operation of the circuit of Fig. 2 when a steady voltage greater than the critical voltage is applied between the faces of the semiconductor.

Fig. 2A shows the idealized current-voltage characteristic curve when no collisions occur in the nostron region for the embodiment shown in Fig. 2. The critical voltage $V_0$ across the nostron region is equal to $$\frac{e0}{e}$$

(see Fig. 1A). When the voltage supplied by the battery B+ (Fig. 2) is less than the critical voltage $V_0$, the first portion or positive slope portion of the curve (Fig. 2A) represents an operating condition where all carriers leaving the electrode A are collected at the electrode B and therefore exhibits the field emission characteristic of electrode A. When the voltage across the nostron region of the crystal reaches a value equal to the critical voltage $V_0$, the electrons from the electrode A are no longer collected at the collector electrode B but return to the electrode A, thereby executing a nostron orbit or a portion thereof. In this instance, no electron starting at rest from electrode A can reach the collector electrode B. As a result, the current at the collector electrode B (Fig. 2) falls to zero (Fig. 2A) when the voltage across the nostron region is equal to the critical voltage $V_0$.

Figure 2B:
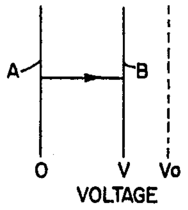
Figs. 2B and 2C are diagrams illustrating carrier travel for the current rising and current cutoff portions, respectively, of the diagram of Fig. 2A.

Fig. 2B is a graphic representation illustrating the electron travel for the positive slope portion of the curve of Fig. 2A or when the voltage applied across the nostron region is less than the critical voltage $V_0$. In this instance, the electrons are collected at electrode B.

Figure 2C:
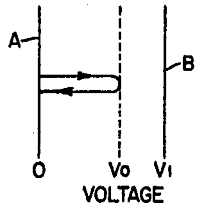

Fig. 2C is a graphic representation illustrating the electron travel for the negative-going portion of the curve shown in Fig. 2A. In this instance, the Voltage $V_1$ applied across the crystal is greater than the critical voltage $V_0$ and the electrons leave the electrode A, perform a nostron orbit, and return to the electrode A.

If the crystal C (Fig. 2) is of germanium, the critical voltage $V_0$ will be a few tenths of a volt. If the thickness $a$ of the nostron region is equal to one micron, the field E (Equation 14) will be a few kilovolts per centimeter and the nostron oscillation wavelength will be of the order of one centimeter.

Figure 3A:
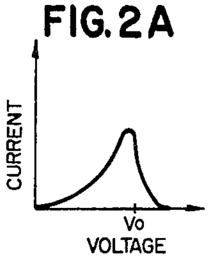
Fig. 3A is a diagram illustrating a deviation from the idealized diagram of Fig. 2A.
Figure 3B:
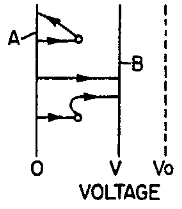
Figs. 3B and 3C are diagrams illustrating representative carrier paths for the current rising and current cutoff portions, respectively, of the diagram of Fig. 3A.
Figure 3C:
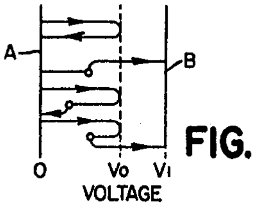

Fig. 3A shows a deviation from the idealized curve of Fig. 2A due to an appreciable probability of collision of the electrons with crystal irregularities and thermal vibrations. These collisions (Fig. 3B) cause a rounding off of the positive slope portion of the curve of Fig. 3A when the voltage across the crystal is less than the critical voltage $V_0$. When the voltage across the crystal is greater than $V_0$ (Fig. 3C), the collisions cause a rounding off of the lower portion of the negative-dynamic-resistance portion of the curve (Fig. 3A).

As a practical matter, a further rounding off of the positive portion and the negative portion of the curve may result from the electron's traversing a fringe path through the crystal of greater length than the mean free path and because of conduction along the surface of the crystal from the electrode A to the electrode B. Such rounding off may be sufficient to permit current flow during the entire descending or negative-dynamic-resistance portion of the curve. It is understood that the construction and formation of the crystal and its associated electrodes will substantially minimize the results of these effects.

It is now clear that the attainment of a negative-dynamic-resistance portion of the characteristic curves (Figs. 2A and 3A) is dependent upon the substantial absence of collisions of the electrons in the nostron region and is realized wholly because of the presence of nostron oscillations or the nostron orbiting of the carriers. The fact that the electrons suffer collisions in practical operation merely alters the particular shape of the characteristic curve so long as the dimension $a$ (Fig. 2) is not substantially greater than the mean free path of the carriers. This alteration, however, is in the nature of a rounding off of the positive-going and the negative-going portions and the negative-dynamic-resistance characteristic remains.

The fact that the current-voltage characteristic includes a negative-dynamic-resistance portion is utilized by the invention to provide novel circuitry which is switchable from one stable condition to the other at substantially the speed of the nostron oscillations as distinguished from a switchable speed determined by the rate of attainment of an equilibrium condition within the crystal or the occurrence of a drift mobility process. The inherent cutoff frequency in the operation of the devices of the invention are given by the transit time of the electron or carrier and hence by the nostron frequency.

Figure 4:
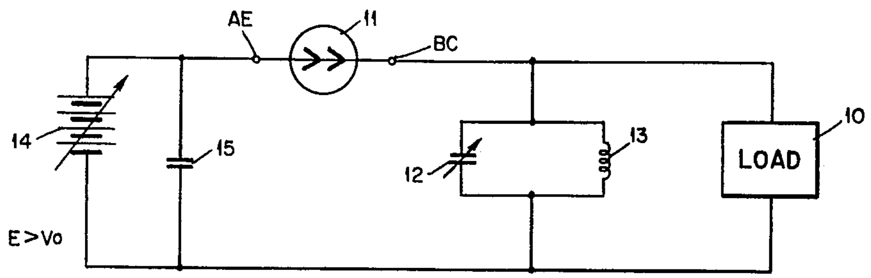
Fig. 4 is a circuit diagram of a parallel resonance oscillator of the invention.
Figure 4A:
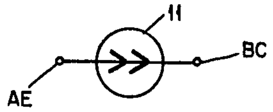
Fig. 4A is a symbolic representation of the nostron device shown in Fig. 2.

Referring to Fig. 4, the parallel resonance oscillator circuit is suitable for providing an output having a frequency up to approximately ten meters. This output is delivered to the load 10. The nostron device 11 is shown diagrammatically in Fig. 4A. This device includes a suitable crystal, such as germanium, having an emitter electrode and a collector electrode on opposite faces thereof and represented, respectively, by terminals AE and BC. Adjustable capacitor 12 in parallel with inductance 13 is connected across the load 10 and to the collector electrode terminal BC. A battery 14 and bypass condenser 15 are connected in parallel and to the emitter electrode terminal AE as shown. The other terminal juncture of 14 and 15 is commonly connected to the load 10, the capacitor 12, and the inductance 13. Condenser 15 is provided to bypass the oscillating current from the battery 14. The nostron device 11 exhibits a shunt capacitance between the electrode terminals AE and BC which is added to that exhibited by the adjustable capacitor 12. At resonance, in order for oscillations to be maintained, the total resistive load exhibited by the load 10 should exceed the dynamic resistance of the remaining portion of the circuit.

Figure 5:
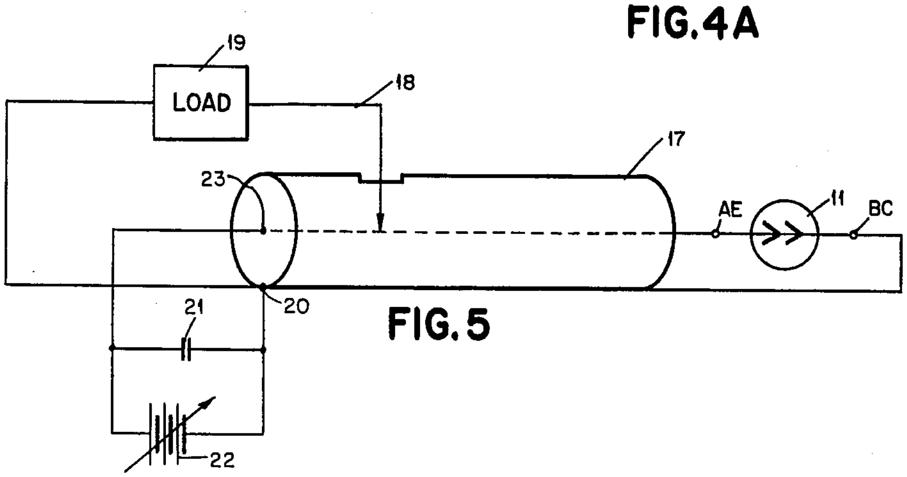
Fig. 5 is a circuit diagram of a coaxial line type oscillator of the invention.

Fig. 5 shows a novel oscillator circuit using a coaxial line. The circuit arrangement shown in Fig. 5 is more suitable for use in the meter wavelength range than is the circuit shown in Fig. 4. Coaxial line 17 is provided with a slit from the outer conductor to its inner conductor to permit slidable contact of arm 18 with the inner conductor of the line. Arm 18 is connected through load 19 to the outer conductor at 20. Bypass condenser 21 and battery 22 are connected in parallel between point 20 and the inner conductor at 23. The other end of the inner conductor of coaxial line 17 is connected to the emitter electrode AE of nostron device 11 having its collector electrode BC connected to the outer conductor as shown. Tuning of the oscillator is effected by sliding arm 18 along the inner conductor to change the effective electrical length of the coaxial line 17.

Figure 6:
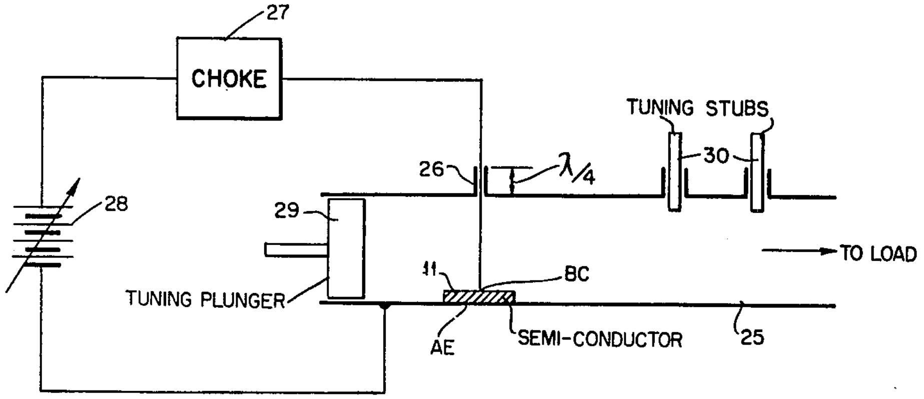
Fig. 6 is a circuit diagram and diagrammatic representation of an oscillator of the invention utilizing a waveguide.

Fig. 6 shows a section of waveguide 25 utilized to provide an oscillator for producing waves in the range of ten centimeters to one millimeter. The output of waveguide 25 is coupled to an appropriate load in any conventional manner. The nostron device 11 is mounted on the outer wall of waveguide 25 as shown and an antenna wire extends upward from collector electrode BC through the quarter-wave sleeve 26, through the wide band choke 27 and battery 28 to the periphery of waveguide 25. Choke 27 prevents the oscillating current from reaching the source of potential 28. The end of the waveguide opposite the load is shorted by tuning plunger 29. Tuning plunger 29 and tuning stubs 30 are adjusted conventionally to provide optimum operation.

Figs. 7A and 7B are a diagrammatic representation of a circular waveguide resonator adapted to provide a nostron oscillator. This circular waveguide resonator 32 is constructed in accordance with the teachings of "A Tunable Low Voltage Reflex Klystron for Operation in the 50 to 60 KMC Band" by E. D. Reed, published in the Bell System Technical Journal, vol. 34, page 563 (1955). Nostron device 11 is affixed to the resonator as shown and an antenna wire is connected from the emitter electrode AE through a sleeve 33 to the common juncture of parallel connected bypass condenser 34 and battery 35.

The other common terminal of condenser 34 and battery 35 is connected to the resonator as shown. The output is extracted by a coupling loop 36. The oscillator is tuned by appropriately squeezing the opposite faces of the resonator 32.

Fig. 8 shows a nostron bistable storage circuit using lumped impedance elements and Fig. 8A shows a current-voltage characteristic curve explanatory of the operation of the circuit of Fig. 8. If a load line intersects the characteristic curve at three points, that is, intersects the negative-dynamic-resistance portion of the curve at one point and intersects each of the two adjoining positive-dynamic-resistance portions at one point, then the two points of intersection on the positive-dynamic-resistance portions of the curve represent stable conditions. Hence, in Fig. 8A, the points X and Y on the characteristic curve, where the load line PQ intersects the positive portions thereof, represent stable conditions of the storage element. These stable conditions are referred to as X and Y, respectively. Hence, when the storage element is in stable condition X, it is in its high current condition of stability and when it is in stable condition Y, it is in its low current condition of stability.

It is apparent from Fig. 8A that the storage element is short circuit stable, that is, a given voltage value in Fig. 8A has only one corresponding current value. In Fig. 8 nostron device 11 is connected through resistor 38 to a source of positive voltage B+ and through resistor 39 to ground. A first input or Set terminal 40 is connected through a capacitor 41 to the terminal AE of nostron device 11 and a second input or Reset terminal 42 is connected through a capacitor 43 to the terminal BC of nostron device 11. Output is derived from either terminal AE or BC or both.

If the storage element of Fig. 8 is initially in stable condition X, it may be placed in stable condition Y by applying a positive pulse to Set terminal 40. This positive pulse shifts load line PQ to position P′Q′. When the storage element is in stable condition Y, it may be placed in stable condition X by applying a positive pulse to Reset terminal 42. This positive pulse shifts load line PQ to position RS. Also, the alternate application of a positive and a negative pulse to either the Set or the Reset terminal will cycle the storage element.

For purposes of explanation, it is assumed that the storage element of Fig. 8 is initially in stable condition X and its operation is explained by conjoint reference to Figs. 8 and 8A. Hence, the positive pulse applied to Set terminal 40 effectively moves the load line PQ to position P′Q′ and switches the storage element to stable condition Y. Stable condition Y is the low current condition of the storage element. Hence, the switching of the stable condition Y causes the current through resistors 38 and 39 to be decreased. This decrease in current means that the voltage drop across resistor 38 and 39 and hence at terminals AE and BC may be used to indicate the stable condition of the storage element. With respect to ground, the output pulse at terminal AE is positive and the output pulse at terminal BC is negative. If high impedance drivers for the Set and Reset terminals are used, the pulse at terminal AE is equal to XY (Fig. 8A) times the value of resistor 38 and the pulse at terminal BC is equal to XY (Fig. 8A) times the value of resistor 39.

If the storage element of Fig. 8 is in stable condition Y and a positive pulse is applied to Set terminal 40, this pulse effectively moves the load line PQ to P′Q′ (Fig. 8A) and the voltage change at terminal AE is equal to YT times the value of resistor 38 and the voltage at terminal BC is equal to YT times the value of resistor 39. Hence, the storage element remains in stable condition Y. It is seen that the pulses at terminals AE and BC differ in both magnitude and polarity and are dependent upon whether or not the storage element is in stable condition X or stable condition Y.

If the storage element is in stable condition Y and a positive pulse is applied to Reset terminal 42, it will effectively move the load line to position RS and switch the storage element to stable condition X. Hence, when the storage element is switched from stable condition Y to stable condition X, the pulse at terminal AE is equal to XY times the values of resistance 38 and is negative relative to ground, and the voltage at terminal BC is equal to XY times the value of resistance 39 and is positive relative to ground.

It is understood, therefore, that for switching to the stable condition X to take place in response to the application of a positive pulse to the Reset terminal 42, it is necessary that that pulse cause a shift of the load line PQ such that during the presence of the pulse the shifted load line clears the remaining portion of the curve adjoining to the points X and Y (Fig. 8A), respectively. It is now clear that when the storage element is in stable condition Y, the application of a negative pulse to Set terminal 40 will switch the storage element to stable condition X as does the application of a positive pulse to Reset terminal 42. Also, when the storage element is in stable condition X, the application of a negative pulse to Reset terminal 42 will switch the storage element to stable condition Y as does the application of a positive pulse to Set terminal 40.

The actual time required by the nostron device 11 to switch from one stable condition to the other is of the order of the period of the nostron oscillation or a fraction of a millimicrosecond. However, the cycling time required to switch the storage element of Fig. 8 is longer than the period of nostron oscillation due to the presence of lumped impedance elements 38, 39, 41 and 43. Hence, the switching time of the storage element is limited by the presence of these lumped impedance elements.

"Germanium Positive-Gap Diode: New Tool for Pulse Techniques" by A. H. Reeves and R. B. W. Cooke, Electrical Communication, June 1955, pages 112–117, there is described a positive-gap diode such as shown in Fig. 3 of British Patent 724,605. This positive-gap diode is open circuit stable in that a given current value has only one corresponding voltage value. This positive-gap diode has a transition time between its two stable states of several millimicroseconds. Hence, its speed of operation is not limited by the presence of lumped impedance elements.

Fig. 8B is a diagrammatic representation of a high speed storage element wherein the speed of the nostron device is not limited by lumped impedance elements. Nostron device 11 is attached to open-ended waveguide 45 as shown. The collector electrode BC is connected via an antenna wire extending through sleeve 46, choke 47 and battery 48 to ground. Initially the storage element is in the high current stable condition or stable condition X.

When the positive pulse shown in Fig. 8B as input 1 is applied through the left end of the waveguide, it induces a voltage in the antenna wire and causes the element to switch to the low current stable condition or stable condition Y thereby providing a negative output represented as output 1 in Fig. 8B. If a negative input pulse is now transferred into the left end of the wave guide such as shown in Fig. 8B as input 2, the storage element is caused to switch back to its high current condition or stable condition X thereby providing a positive output shown as output 2 at the right end of the waveguide in Fig. 8B. A similar alternative receipt of inputs 1 and 2 will permit a cycling of the storage element at substantially the nostron frequency. The inputs 1 and 2 and the outputs 1 and 2 in Fig. 8B are shown as rectangular wave pulses to emphasize the polarity selection of the storage element. It is understood, of course, that certain pulse distortion such as pulse differentiation may take place within the waveguide unless the guide is specifically designed to pass pulses of this short duration.

In Fig. 8C, the nostron device 11 is affixed to an end wall of output waveguide section 51 and its emitter electrode is connected through a resistive coating 52 to which a coupling loop 53 is connected. This coupling loop extends through sleeve 54 into input waveguide section 55 and forms a similar loop therein and extends through bypass condenser 56 to battery 57. The negative terminal of battery 57 is connected to the outer wall of the waveguide. Tuning stubs 58 and 59 are provided to permit adjustment for optimum operation. Input pulses are applied as in Fig 8B to the input end of the input waveguide 55 to provide an output similar in polarity to the outputs in Fig. 8B at the output end of output waveguide 51. The resistive coating 52 of nostron device 11 is provided to permit greater speed of operation than can be realized with a lumped resistive element since the thin coating is almost entirely free of inductance and capacitance. It is deemed apparent that the input and output ends of the storage element of Fig. 8C may be reversed without affecting the operation of the element. The value of the bias voltage supplied by battery 57 (Fig. 8C) determines the particular load line utilized and the initial stable condition of the device.

The equivalent electrical circuit for the storage element of Fig. 8C is shown in Fig. 8D. The fact that this equivalent circuit includes a lumped resistance 60 will mean that its actual speed of operation is substantially the same as that of the storage element of Fig. 8.

Fig. 9 is a pulse generation circuit adapted to provide a train of rectangular pulses at the output terminals in response to an input applied to input terminal 65. This input may be a sine wave or pulses to be reshaped. Input terminal 65 is connected to apply the input to terminal AE. Terminal BC of nostron device 11 is connected through resistor 68 to the negative terminal of battery 69 which has its positive terminal connected through resistor 70 to the terminal AE of nostron device 11. The output is derived from across resistor 68.

Fig. 9A illustrates the operation of the pulse generator shown in Fig. 9. When the input pulse or wave goes positive, load line PQ (Fig. 9A) is shifted to RS to transfer the nostron device from stable condition X to stable condition Y and provide a negative voltage pulse at the output (curve *a*, Fig. 9) across resistor 68. When the input pulse applied to input 65 goes negative, the load line is shifted from position RS to position PQ and the nostron device is switched from stable condition Y to stable condition X to provide a positive voltage pulse at the output (curve *a*, Fig. 9) terminals across resistor 68.

If the bias provides by battery 69 is appropriately increased, the position of the load line is shifted to provide an output such as shown, for example, by curve *b*, Fig. 9. Hence, by appropriately changing the bias supplied by battery 69, a variety of outputs determined by the current-voltage curve shown in Fig. 9A and the amplitude of the input can be obtained.

The circuit of Fig. 9 is sufficient to provide an output pulse having a duration of approximately ten millimicroseconds. If it is desired to produce output pulses having a duration as short as approxmately one-tenth of a millimicrosecond, a pulse generator utilizing a waveguide or coaxial cable is used. If the output pulses are to be transmitted short distances, the use of the coaxial line may be preferable to a waveguide even though the attenuation caused by the use of a coaxial cable is greater because the coaxial cable permits operation over a broader frequency band and provides pulses which are more rectangular than those provided by the waveguide system.

Fig. 10 is a pulse regeneration or shaping circuit adapted to reshape a positive degenerated input pulse applied to input terminal AE of nostron device 11 into a negative output pulse at terminal BC thereof. The center conductor at one end of coaxial line 71 is connected through nostron device 11 as shown and resistor 72 to the outer conductor thereof. Battery 73 is connected between the conductors at the other end of coaxial line 71. Nostron device 11 is initially in stable condition X or its high current condition. When the positive input pulse is applied to the terminal AE, it causes the nostron device to be switched to its stable condition Y or its low current condition and provide a decreased voltage at output terminal BC. The positive input pulse is also transferred down the coaxial line 71 and reflected back to the terminal AE as a negative pulse. This reflected negative pulse causes the nostron device to be switched from stable condition Y to stable condition X, provide an increased negative voltage at output terminal BC and restore the nostron device to its initial stable condition or stable condition X. Hence, a rectangular wave output is provided at the output terminal BC. The duration of the rectangular output pulse of terminal BC is determined by the length of delay line 71. By proper positioning of the load line, which is determined by the value of resistor 72, a predetermined voltage amplification may be provided at the output terminal BC.

The pulse amplifying circuit of Fig. 11 produces a reshaped, inverted or negative pulse at the output terminal BC when a positive degenerated pulse is applied to terminal 75. Input terminal 75 is connected through isolation diode 76 to input terminal AE of nostron device 11. Terminal BC of nostron devce 11 is connected through inductance 77 and resistor 78 in parallel to ground. Terminal AE is also connected through resistor 79 and battery 80 to ground.

Initially, nostron device 11 is in the high current state or stable condition X as shown by static load line PQ (Fig. 9A) and this is the only stable condition of the device. When the input pulse is transferred through diode 76 to input terminal AE of nostron device 11, it tends to switch the device to stable condition Y. However, the action of inductance 77 prevents such a switching and causes the device to have only one stable condition, viz., stable condition X. Since current through inductance 77 cannot be changed instantaneously, the current through nostron device 11 remains substantially constant and the voltage thereacross increases until it reaches point Z (Fig. 9A). Simultaneously with this voltage change across nostron device 11, the inductance 77 provides a spike negative output at the output terminal BC. This action is illustrated in Fig. 9A wherein the most negative portion of the spike corresponds to the voltage at Z. Collapse of the magnetic field in inductance 77 causes the output to go positive and after substantially complete collapse of the field, nostron device 11 returns along the current-voltage curve (Fig. 9A) to its only stable condition X. As the voltage across nostron device 11 follows the negative-dynamic-resistance portion of the current-voltage curve (Fig. 9A) during its return to stable condition X, the substantially vertical and positive pulse or transient portions of the output are provided.

In the crystal utilized by the invention, the parallel faces thereof act as electrodes to respectively emit and collect. If during operation a voltage change sufficient to switch the nostron device from one stable condition to the other is applied, the switching of the device is not instantaneous because of the finite transit time of the carriers within the nostron region. If this voltage change is present during a time less than the period of the nostron orbits, there is no certainty that a switching will be accomplished. If this voltage change is applied during a time not substantially longer than the period of the nostron orbit, then the switching of the device is effected within the time required to complete a single nostron orbit.

In order for the nostron orbits to be effected, the mean free path of the carrier motion should be less than the base thickness (see *a*, Fig. 2) of the crystal. The length of the mean free path increases with a lowering of the temperature. Hence, the mean free path at room temperature is less than the mean free path at the temperature of liquid helium.

The actual fabrication of the crystal and the emitter and collector electrodes maybe accomplished in any suitable manner. In this connection it is emphasized that the presence of the nostron orbiting of the carriers and the production of the current-voltage characteristic curve utilized by the invention is not attributable to any particular fabrication of the electrodes.

Some of the techniques for forming and fabricating electrodes and crystals are indicated in:

(1) "Intrinsic Optical Absorption in Single-Crystal Germanium and Silicon at 77° K and 300° K" by Dash and Newman, Physical Review, vol. 99, August 15, 1955, page 1151.

(2) "p-n Junction Transistors" by Shockley, Sparks and Teal, Physical Review, vol. 83, July 1, 1951, pages 151–162.

(3) "The Surface-Barrier Transistor" by W. E. Bradley, Proceedings of the I.R.E., vol. 41, December 1953, pages 1702–1720.

(4) "Rectification Properties of Metal Semiconductor Contacts," by Borneman, Schwarz and Stickler, Journal of Applied Physics, vol. 26, No. 8, August 1955, pages 1021–1028.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims:

What is claimed is:

1. A very high speed bistable device including in combination: an input section of an electromagnetic wave guide; an output section of an electromagnetic wave guide; an apertured end wall portion joining said input and said output sections of electromagnetic wave guide, said end wall portion having a first surface facing said input wave guide section and a second surface facing said output wave guide section; a germanium wafer disposed within said output wave guide section, and having first and second surfaces, said first surface of said germanium wafer being adjacently positioned to, and in electrical contact with said second surface of said end wall portion; a thin resistive coating disposed upon said second surface of said germanium wafer; electrical means including a potential source; an electrical conductor connected between said thin resistive coating and said source of potential, said electrical conductor electromagnetically coupling said input section of electromagnetic wave guide to said output section of electromagnetic wave guide; and means for introducing an input electrical manifestation into said input wave guide section, whereby said germanium wafer changes from a first state of conductivity to a second state of conductivity and an output electrical manifestation, indicative of the change in conductivity of said germanium wafer, is introduced into said output section of electromagnetic wave guide.

2. A very high speed bistable device including in combination: an input section of an electromagnetic wave guide; an output section of an electromagnetic wave guide; an apertured end wall portion joining said input and said output sections of electromagnetic wave guide, said end wall portion having a first surface facing said input wave guide section and a second surface facing said output wave guide section; a semiconductor wafer, approximately one micron in thickness, disposed within said output wave guide section, and having first and second surfaces, said first surface of said semiconductor wafer being adjacently positioned to, and in electrical contact with said second surface of said end wall portion; a thin resistive coating disposed upon said second surface of said semiconductor wafer; a potential source; a by-pass capacitor connected to said source of potential; an electrical conductor connected between said thin resistive coating and said by-pass capacitor, said conductor electromagnetically coupling said input section of electromagnetic wave guide to said output section of electromagnetic wave guide; and means for introducing an input electrical manifestation into said input wave guide section, whereby said semiconductor wafer changes from a first state of conductivity to a second state of conductivity and an output electrical manifestation, indicative of the change in conductivity of said semiconductor wafer, is introduced into said output section of electromagnetic wave guide.

3. A very high speed bistable device including in combination: an input section of an electromagnetic wave guide; an output section of an electromagnetic wave guide; an apertured end wall portion joining said input and said output sections of electromagnetic wave guide, said end wall portion having a first surface facing said input wave guide section and a second surface facing said output wave guide section; a germanium wafer having a thickness less than the mean free path of the carriers therein, and disposed within said output wave guide section, said germanium wafer having first and second surfaces, said first surface of said germanium wafer being adjacently positioned to, and in electrical contact with said second surface of said end wall portion; a thin resistive coating disposed upon said second surface of said germanium wafer; electrical means including a potential source and an electrical conductor connected between said thin resistive coating and said source of potential, and electromagnetically coupling said input section of electromagnetic wave guide to said output section of electromagnetic wave guide; and means for introducing an input electrical manifestation into said input wave guide section, whereby said germanium wafer changes from a first state of conductivity to a second state of conductivity and an output electrical manifestation, indicative of the change in conductivity of said germanium wafer, is introduced into said output section of electromagnetic wave guide.

References Cited in the file of this patent

UNITED STATES PATENTS

| | | |
|---|---|---|
| 2,565,497 | Harling | Aug. 28, 1951 |
| 2,569,347 | Shockley | Sept. 25, 1951 |
| 2,647,995 | Dickinson | Aug. 4, 1953 |
| 2,678,400 | McKay | May 11, 1954 |
| 2,899,652 | Read | Aug. 11, 1959 |